United States Patent [19]
Raney

[11] Patent Number: 5,644,979
[45] Date of Patent: Jul. 8, 1997

[54] DIE CUTTING AND STAMPING PRESS HAVING SIMULTANEOUS X, Y, AND Ø AXES DIE REGISTRATION MECHANISM AND METHOD

[75] Inventor: Charles C. Raney, Lenexa, Kans.

[73] Assignee: Preco Industries, Inc., Lenexa, Kans.

[21] Appl. No.: 641,413

[22] Filed: Apr. 30, 1996

[51] Int. Cl.⁶ .............................. B30B 15/02; B26D 5/00
[52] U.S. Cl. ...................... 100/35; 83/34; 83/368; 100/48; 100/226
[58] Field of Search .................. 100/35, 43, 45, 100/48, 49, 226, 229 R, 918; 83/34, 74, 216, 365, 368, 559

[56] References Cited

U.S. PATENT DOCUMENTS

| | | | |
|---|---|---|---|
| 3,370,492 | 2/1968 | Treff | 83/34 |
| 3,584,487 | 6/1971 | Carlson . | |
| 3,848,490 | 11/1974 | Arel | 83/368 |
| 4,240,778 | 12/1980 | Korytko . | |
| 4,343,670 | 8/1982 | Brown . | |
| 4,399,675 | 8/1983 | Erdmann et al. | 100/45 |
| 4,409,063 | 10/1983 | Brown . | |
| 4,481,847 | 11/1984 | Schneider et al. . | |
| 4,555,968 | 12/1985 | Raney et al. | 83/368 |
| 4,624,126 | 11/1986 | Avila et al. . | |
| 4,697,485 | 10/1987 | Raney | 83/34 |
| 4,706,565 | 11/1987 | Martin et al. . | |
| 5,201,204 | 4/1993 | Hinterman et al. . | |
| 5,212,647 | 5/1993 | Raney et al. | 83/34 |
| 5,299,444 | 4/1994 | Kirii et al. . | |
| 5,517,910 | 5/1996 | Skahan | 101/27 |
| 5,535,655 | 7/1996 | Kammann | 83/559 |

*Primary Examiner*—Stephen F. Gerrity
*Attorney, Agent, or Firm*—Hovey, Williams, Timmons & Collins

[57] ABSTRACT

In a die cutting press for elongated material, a registration system includes a die unit that is shiftable along the path of travel of the material, along a direction of travel transverse to the path of travel, and about a reference axis perpendicular to a plane containing the material. At least one camera is provided for receiving images from the desired locations that are occupied by indicia on the material when defined areas of the material are in a predetermined relationship relative to the die unit. Reference image data representative of the desired locations of the indicia relative to the die unit is produced so that a comparison can be made between the reference image data and the actual positions of the indicia. This permits a controller to change the position of the die unit relative to the material to compensate for the difference in position between the indicia within the image and the desired locations of the indicia so that one of the defined areas of the material is positioned in the desired predetermined relationship with the die unit.

16 Claims, 5 Drawing Sheets

DIE CUTTING AND STAMPING PRESS HAVING SIMULTANEOUS X, Y, AND Ø AXES DIE REGISTRATION MECHANISM AND METHOD

BACKGROUND OF THE INVENTION

1. Field of the Invention

The present invention relates generally to a die cutting press, and more particularly to a registration system for registering defined areas of web, strip or sheet material with a die unit provided on the press in order to permit accurate processing of the material.

2. Discussion of the Prior Art

A die cutting press is disclosed in U.S. Pat. No. 4,555,968, to Raney. The press disclosed in U.S. Pat. No. 4,555,968 has a shiftable die unit supported on a cushion of air, and the die unit is movable laterally of the direction of travel of the web or strip as well as rotatably about an upright axis perpendicular to the material in order to bring the die unit into precise registration with defined areas of the material to be processed or cut by the press.

Automatic operation of this known press is provided by a control system having two groups of photo-optical sensors which are disposed to detect the presence of two T-shaped marks provided on opposite sides of the material adjacent each defined area to be cut. The control system is electrically coupled to servomotor mechanisms for adjustably positioning the die unit once advancement of the material is interrupted and a defined area on the material is in general proximity to work structure of the press die unit.

As shown in U.S. Pat. No. 4,697,485, to Raney, a die cutting press is provided with a registration system which is operable to provide precise alignment of a shiftable die cutting unit along two axes during the time that the material is advanced along a third axis toward the die unit, so that as soon as a defined area of the material reaches the die unit, the press can be immediately actuated to subject the material to the die cutting operation. Continuous monitoring of an elongated indicator strip provided on the material enables the die unit to be shifted as necessary during travel to insure lateral and angular registration prior to the time that material advancement is interrupted.

As disclosed in U.S. Pat. No. 5,212,647, to Raney, a die cutting press is provided with a registration system that quickly and accurately aligns defined areas of a web or strip of material with a movable die unit without requiring the use of elaborate or continuous marks of more than two sensing devices for determining the location of the marks relative to the die unit. The registration system employs a pair of reference indicia fixed on a bolster of the press for indicating the position at which the indicia on the strip of material appear when the defined areas of the material are in a desired predetermined relationship relative to the die unit supported on the bolster.

Although the accuracy provided by the known prior art registration systems is very good, such presses are relatively slow, being able to operate at speeds no faster than about 20 strokes per minute. Accordingly, it would be desirable to provide a registration system that maintains the accuracy of the known constructions while enabling much faster operation.

OBJECTS AND SUMMARY OF THE INVENTION

It is an object of the present invention to provide such a registration system capable of providing the same accuracy as the above-mentioned constructions, but at a much faster press speed so that as many as 40 or more strokes per minute can be achieved.

It is another object of the present invention to provide a registration system that maintains constant tension on the material by adjusting the longitudinal position of the die unit rather than the longitudinal position of the material. Thus, longitudinal, lateral and angular adjustments are all carried out on the die unit while the material remains fixed.

Yet another object of the present invention is to provide a registration system in which longitudinal, lateral and angular adjustments of the die unit are carried out simultaneously based on a comparison between the actual positions of the indicia relative to the desired locations thereof.

In accordance with these and other objects evident from the following description of a preferred embodiment of the invention, a die cutting press is provided for elongated material having defined, successive areas and indicia provided in predetermined positions relative to each of the defined areas. The press includes a frame, a base platen fixed to the frame, a ram platen shiftable toward and away from the base platen, a die unit received in the space between the base platen and the ram platen, and a feeding means for advancing the material along a path of travel to successively feed the defined areas of the material a predetermined distance toward the die unit. A registration system is provided for successively positioning the die unit in a desired predetermined relationship to the defined areas of the material as successive defined areas are brought into a position to be processed by the die unit.

The registration system comprises a longitudinal shifting means for moving the die unit relative to the base platen along the path of travel of the material, a lateral shifting means for moving the die unit relative to the base platen along a direction of travel transverse to the path of travel of the material, and an angular shifting means for rotating the die unit relative to the base platen about a reference axis perpendicular to a plane containing the material. At least one camera receives images from the desired locations that are occupied by the indicia when the defined areas of the material are in the predetermined relationship relative to the die unit.

A reference means provides reference image data representative of the desired locations of the indicia relative to the die unit, and a comparison means compares the reference image data with the actual positions of the indicia within the images received by the at least one camera after the material has been advanced by the feeding means. The comparison means also generates longitudinal, lateral and angular difference data representative of the difference in position between the indicia within the image and the desired locations of the indicia. A control means receives the longitudinal, lateral and angular difference data and operates the longitudinal, lateral and angular shifting means to change the position of the die unit relative to the material to compensate for the difference in position between the indicia within the image and the desired locations of the indicia so that one of the defined areas of the material is positioned in the desired predetermined relationship with the die unit.

By providing a registration system in accordance with the present invention, numerous advantages are realized. For example, in known registration systems, the use of the material feed mechanism in registering the longitudinal position of the material relative to the die unit significantly slowed down operation of the press. By providing a longitudinal shifting means for shifting the die unit, it is not necessary to use the material feed mechanism to register the material. Instead, the feed mechanism in the inventive registration system is used only as a coarse feed mechanism for quickly advancing the material a predetermined distance toward the die unit, and registration is achieved strictly through movement of the die unit.

In addition, by holding the web fixed on the base platen during registration, it is possible to maintain a constant tension on the material so that the material does not stretch or tear during operation of the press. This increases the accuracy of the press and results in more reliable operation than the conventional constructions.

Preferably, a vacuum tensioning means is provided for tensioning the material during operation of the press, reducing friction between the material and the tensioning means so that the material can be advanced more quickly than in prior art constructions that employ dancer rollers or the like.

The method of the present invention includes, among other steps, the steps of longitudinally advancing the material along a path of travel to successively feed the defined areas of the material a predetermined distance toward the die unit, comparing reference image data with the actual sensed positions of the indicia within images received by at least one camera, generating longitudinal, lateral and angular difference data representative of the difference in position between the indicia and the desired locations of the indicia, and simultaneously moving the die unit along the path of travel of the material, along a direction of travel transverse to the path of travel, and relative to the base platen about a reference axis perpendicular to a plane containing the material to register the die unit with the material.

BRIEF DESCRIPTION OF THE DRAWING FIGURES

The preferred embodiment of the present invention is described in detail below with reference to the attached drawing figures, wherein.

DETAILED DESCRIPTION OF THE PREFERRED EMBODIMENT

Figure 1:
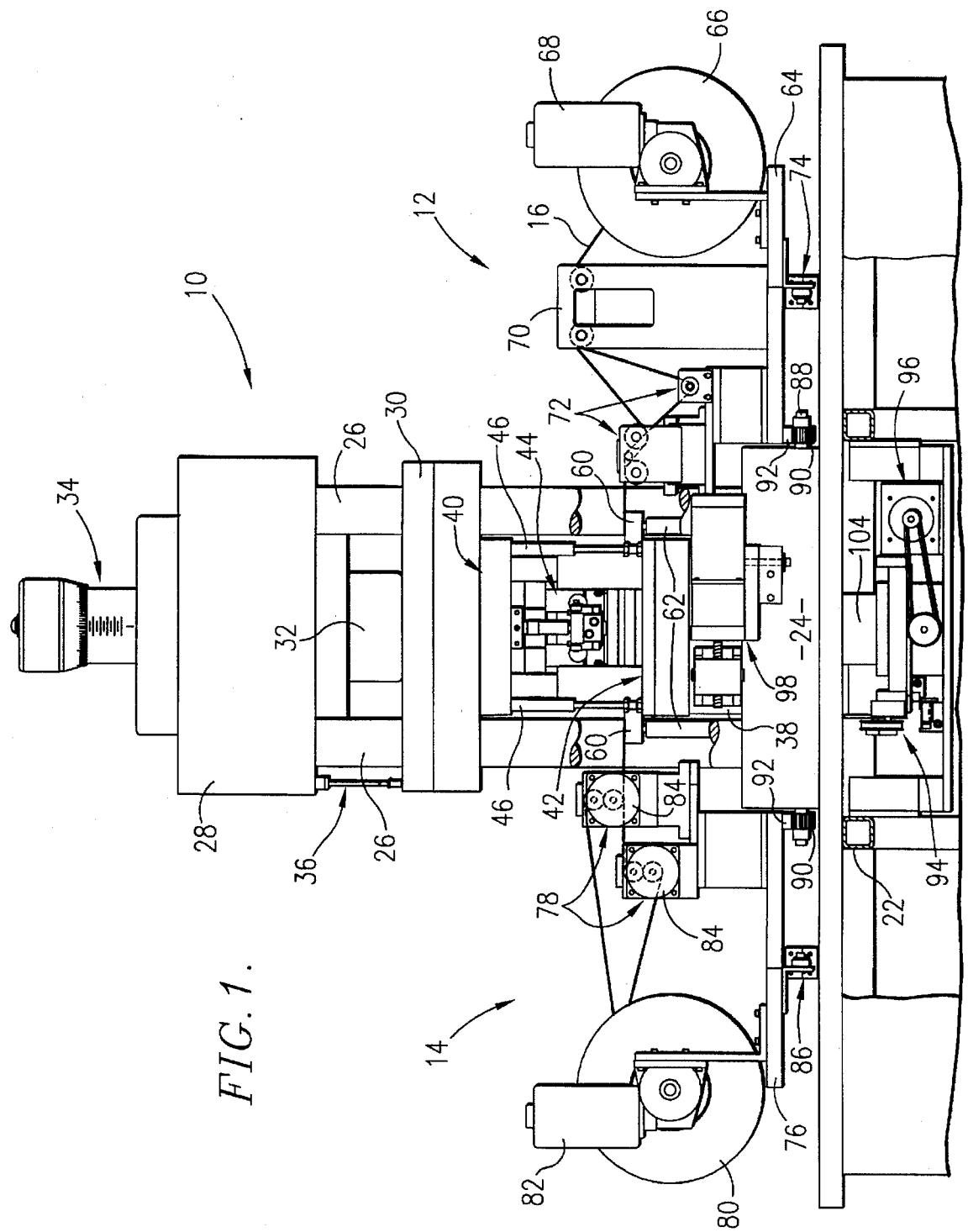
FIG. 1 is a side elevational view of a die press constructed in accordance with the preferred embodiment.
Figure 7:
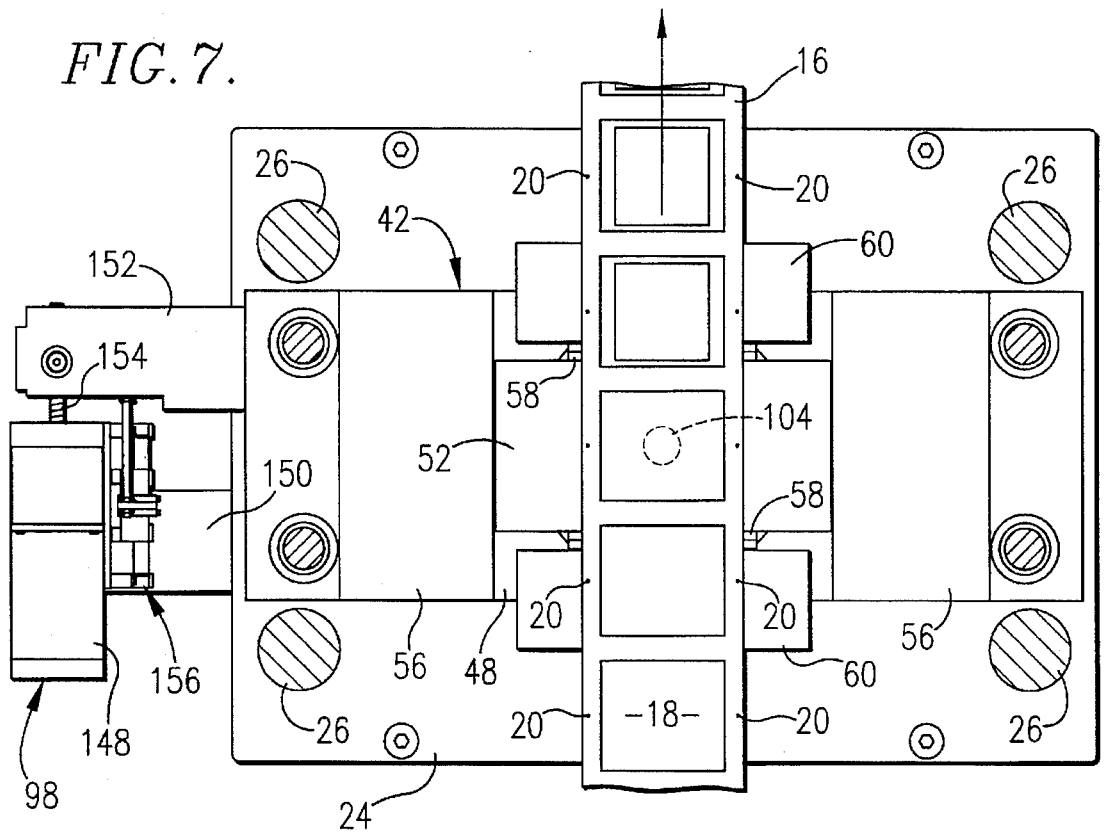
FIG. 7 is a fragmentary sectional view similar to FIG. 2, illustrating an elongated piece of material positioned in the apparatus with a defined area of the material in a desired predetermined relationship relative to the die unit.

A die cutting press constructed for use with the present invention is illustrated in FIG. 1, and includes a die cutting press 10, a material supply assembly 12, and a material take-up assembly 14. The press is adapted for use in processing an elongated piece of material 16 such as a web, strip or sheet, as shown in FIG. 7, wherein the material includes successive defined areas 18 and a pair of indicia 20 provided in predetermined positions relative to each of the defined areas. An example of a material capable of being processed in the die cutting press is a synthetic resin backing material having a thickness of 1–2 mils and being adapted for receipt of a soft, unfired ceramic material that is used in the production of capacitors. However, other materials of varying thicknesses may also be processed in the die cutting press.

The die cutting press 10 is shown in FIG. 1, and is in general similar to the press disclosed in the aforementioned U.S. Pat. Nos. 4,555,968, 4,697,485, and 5,212,647, which are incorporated into the disclosure of the present invention by this express reference. The press includes an upstanding frame 22 on which a base platen 24 of relatively heavy, thick metal stock is secured. Four upstanding rods 26 are fixed to the corners of the base platen and support an upper frame assembly 28. A ram platen 30 is reciprocally carried by the rods below the frame assembly and is vertically shiftable by means of a piston 32. A micrometer unit 34 mounted to the top of the upper frame assembly permits selective adjustment of the extent of vertical shifting of the ram platen, and a sensing mechanism 36 such as a glass scale is supported between the upper frame assembly and the ram platen for providing feedback to a controller regarding the vertical position of the ram platen.

Figure 3:
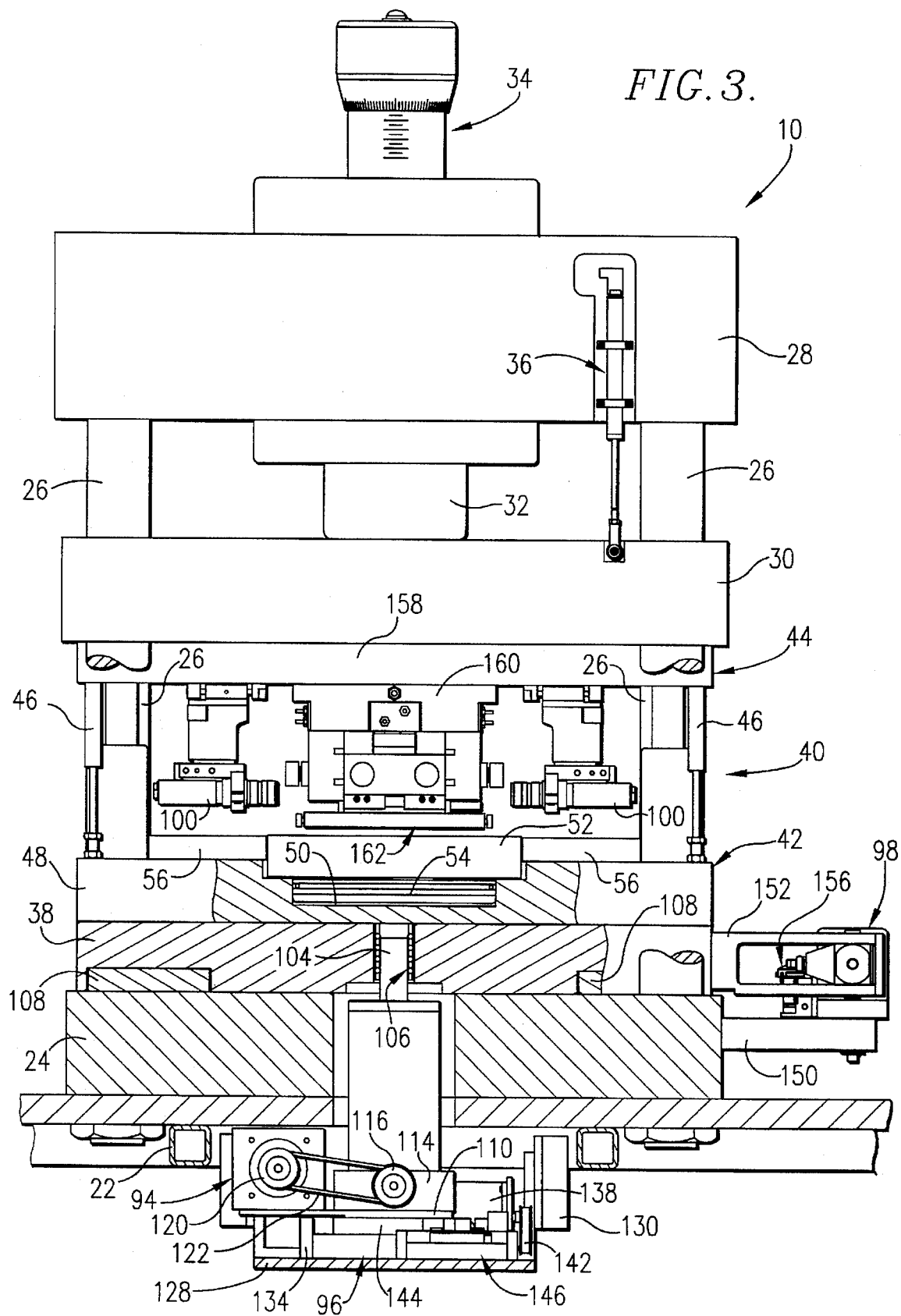
FIG. 3 is a fragmentary rear elevational view, partly in section, illustrating the die unit and a registration system forming a part of the apparatus.

With reference to FIG. 3, a floating bolster 38 is supported on top of the base platen, and a die unit 40 rests on the bolster. The die unit generally includes a lower platen assembly 42, an upper die assembly 44, and four spring biased cylinder assemblies 46 that are positioned between the platen assembly and the die assembly for permitting the die assembly to be moved toward and away from the platen assembly. The spring cylinder assemblies 46 are biased to normally hold the die assembly in spaced relationship to the lower platen assembly in order to permit the material to be passed and positioned therebetween. The ram platen 30 functions to selectively transmit a downward force to the die assembly to carry out a die cutting of defined areas of the material. The ram platen is not affixed to any component of the die unit.

The terminology "die cutting" as used herein is intended to be construed generically and to encompass various types of processing operations including but not limited to stamping, cutting, punching, piercing, blanking, embossing and other similar procedures.

The lower platen assembly 42 includes a rectangular metallic die shoe 48 presenting an upper cylindrical reservoir 50, and a platen 52 presenting an uppermost operating surface on which the material is supported, wherein the platen includes a lower, cylindrical piston member 54 that is received in the reservoir 50. The reservoir is filled with a motive fluid and a circumferential seal is provided on the piston for sealing off the reservoir so that the platen floats on the die shoe and rocks about an axis parallel with the operating surface in order to accommodate the position and orientation of the die during stamping. One embodiment of such a self-leveling platen assembly is disclosed in U.S. application Ser. No. 08/367,958, filed Jan. 3, 1995 (now U.S. Pat. No. 5,517,910), which is incorporated herein by this express reference.

Figure 2:
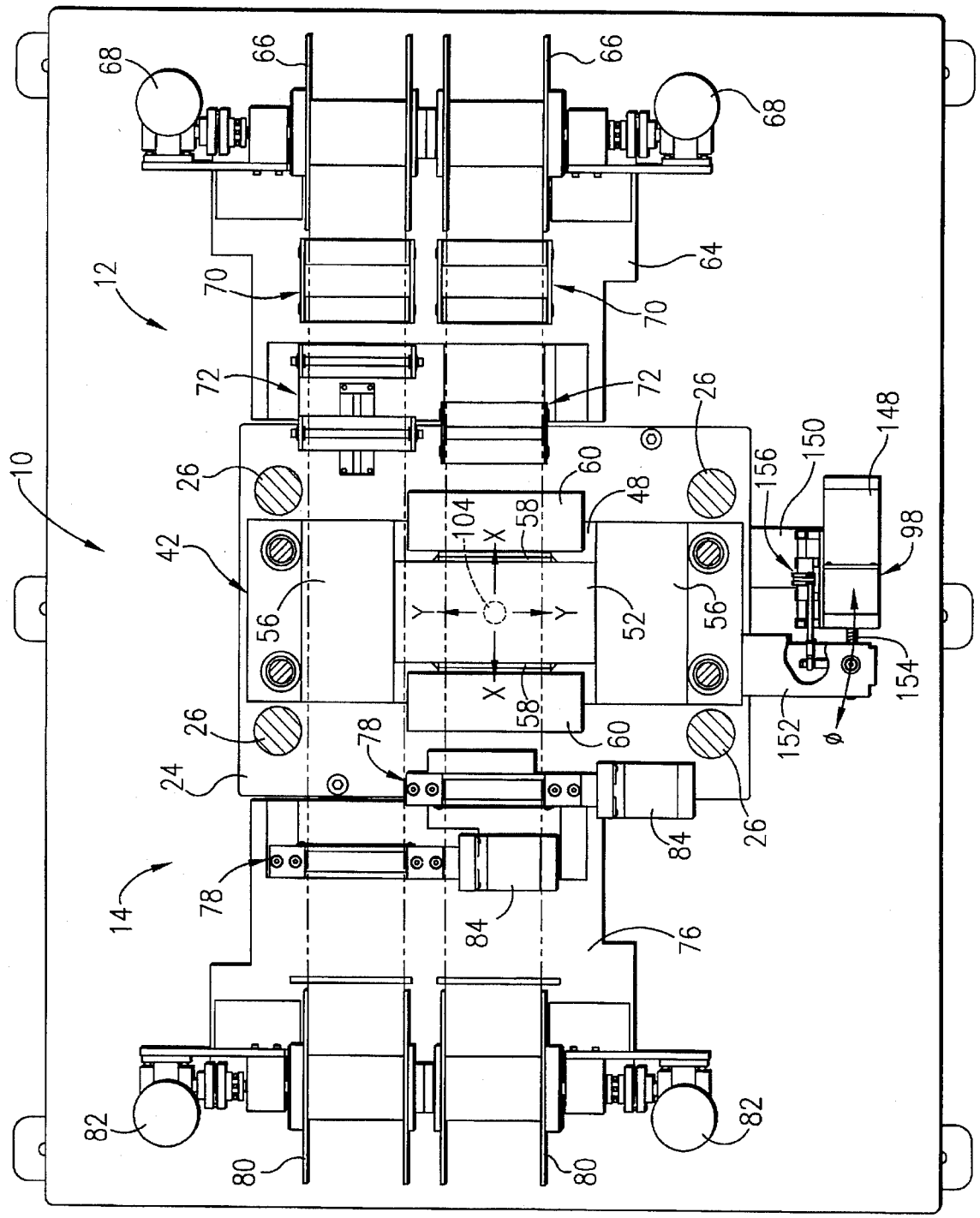
FIG. 2 is a sectional view of the die press taken from beneath an upper platen assembly of a die unit forming a part of the apparatus in a direction toward a lower platen assembly of the die unit.

With reference to FIG. 2, the platen 52 is rectangular in shape, and a pair of stationery plates 56 are secured to the upper surface of the die shoe 48 on opposite sides of the platen and are of a thickness substantially equal to the thickness of the platen. A pair of vacuum bars 58 are supported along the edges of the platen and extend in a direction parallel to the Y axis. The vacuum bars span the path of travel of the material so that once the die unit is registered with the material, a vacuum is drawn through the bars to hold the material down on the die unit during processing.

The base platen 24 also includes a pair of vacuum bars 60 that extend parallel to the Y axis and span the path of travel of the material. The vacuum bars 60 are disposed above the die shoe 48 and are of a height corresponding to the height of the platen 52 so that the upper surfaces of the vacuum bars 60 are generally flush with the upper surface of the platen. As shown in FIG. 1, the vacuum bars 60 are secured to the base platen 24 by vertical legs 62 that extend between the vacuum bars and the base platen along the side of the floating bolster 38. By providing this construction, it is possible to hold the material down against the vacuum bars 60 while shifting the die unit along the X, Y and Ø axes.

As shown in FIG. 2, the preferred material supply assembly 12 is supported on a carriage 64 that is movable relative to the die press in a direction transverse to the path of travel of the material, and broadly includes a pair of supply reels 66 for supporting first and second webs of material, motors 68 for driving the reels, vacuum tensioning assemblies 70, and guide rollers 72 for guiding the webs through the die unit. An air cylinder assembly 74 is supported between the frame 22 and the carriage 64 for moving the carriage laterally between a first position in which the first web of material is aligned with the die unit and a second position in which the second web of material is aligned with the die unit. The supply reels 66 are driven by the motors to unwind the webs of material so that the material can be fed through the die press to position the defined areas of the material relative to the die unit. The vacuum tensioning assemblies maintain a predetermined tension on the webs during feeding, and the guide rollers guide the web into the die unit.

The material take-up assembly 14 is also supported on a carriage 76 that is movable relative to the die press in a direction transverse to the path of travel of the material, and includes two sets of drive rollers 78, a pair of take-up reels 80, and motors 82 for driving the reels. A stepper 84 or servo motor is provided for driving each set 78 of drive rollers, and functions as a coarse feed means for quickly advancing the material along the path of travel to successively feed the defined areas a predetermined distance toward the die unit. For example, if the total distance between successive defined areas on one of the webs is 5 inches, the corresponding drive motor would drive the rollers to coarse feed the material 5 inches, plus or minus a couple of thousandths of an inch, in about 270 milliseconds. As discussed below, a controller presets this predetermined distance for each operation of the feed means, and adjusts the predetermined distance to compensate for coarse misregistration along the X axis.

The take-up reels 80 are driven by the motors 82 to collect the webs of material, but do not function as a feeding means. As shown in FIG. 1, an air cylinder assembly 86 is connected between the frame 22 and the carriage 76 for moving the carriage laterally between a first position in which the first web of material is aligned with the die unit and a second position in which the second web of material is aligned with the die unit. A pair of rotatable shafts 88 extend through the base platen 24 in a direction parallel to the path of travel of the material, and each shaft presents a pair of opposed axial ends that extend beyond the base platen. A pinion gear 90 is secured on each end of each shaft 88 so that rotation of either pinion on each shaft is transmitted to the other pinion on the opposite side of the base platen. A rack gear 92 is supported on the underside of each of the carriages 64, 76, and these rack gears engage the pinion gears so that each carriage moves in alignment with the other upon actuation of the air cylinder assemblies.

Although the preferred embodiment illustrated in the drawing includes a means for supporting and feeding two side-by-side webs of material through the die press, it is understood that the invention has equal applicability with presses through which only a single web or strip of material is passed. The dual-web embodiment has particular applicability in the production of capacitors, where alternating layers of printed ceramic substrate are cut and stacked on top of one another. By shifting the carriages between each stroke of the press, these alternating layers are brought into registration with the die unit so that each layer is cut and stacked in proper sequence by the die unit.

As illustrated in FIG. 1, a registration system is provided for successively positioning the die unit in a desired predetermined relationship to the defined areas of the material as successive defined areas are brought into a position to be processed by the die unit. The registration system broadly includes longitudinal, lateral and angular shifting assemblies 94, 96, 98 for changing the position of the die unit relative to the material, a pair of cameras 100 focused on the die unit to receive images showing the relative positions of the die unit and material, and a controller 102, shown in FIG. 9, for comparing the actual relative positions of the die unit and material with the desired relative positions thereof, and for controlling operation of the longitudinal, lateral and angular shifting assemblies to change the position of the die unit to register the unit with the material.

As illustrated in FIG. 3, the longitudinal, lateral and angular shifting assemblies act on the die unit through the floating bolster 38 to adjust the position of the die unit 40 prior to each stroke of the press. The floating bolster is rectangular in shape, and is supported on the upper surface of the base platen 24. The bolster includes an upper support surface on which the die unit rests and an opposed bottom surface adjacent the base platen. The bolster extends laterally between the upstanding rods 26 of the frame and presents opposed lateral side walls that are spaced slightly inwardly from the side walls of the base platen. A vertical hole extends through the bolster at the central vertical axis thereof for receiving a pin 104 that is used to shift the bolster along the path of travel of the material and in a direction transverse to the path of travel. In addition, the pin supports the bolster for rotational movement about the central axis. A bearing assembly 106 is provided between the pin 104 and the bolster 38 for guiding this angular rotation of the bolster.

In order to simplify an understanding of the registration system of the present invention, the direction extending along the path of movement of the material through the vertical axis of the bolster is referred to as the longitudinal direction or the X axis. The direction extending transverse to the path of travel of the material is referred to as the lateral direction or the Y axis. The direction of rotation of the bolster about the pin 104 is referred to as the angular direction or the Ø axis.

The bottom surface of the bolster includes a pair of upwardly extending recesses, each displaced from the pin 104. Each recess is rectangular in shape and is sized for receipt over an air bearing 108 that is secured to the upper surface of the base platen. The air bearings 108 are provided with a large number of air passageways that extend through the upper surfaces of the bearings toward the underside of the bolster so that when air is supplied to the air bearings, the air lifts the bolster and supports it on a cushion of air between the bearings and the bolster so that the bolster is free to shift longitudinally, laterally and angularly relative to the base platen.

Figure 6:
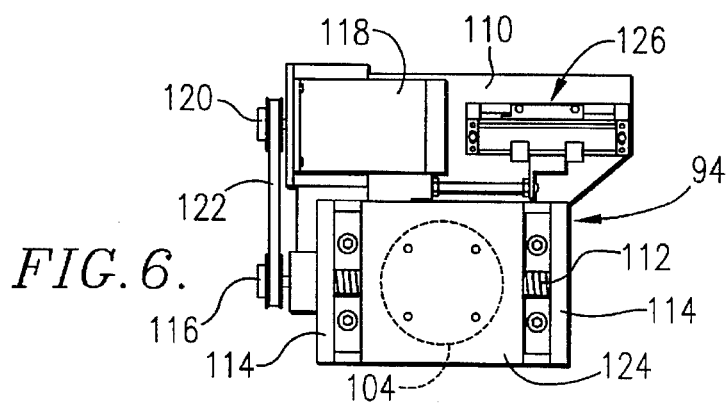
FIG. 6 is a top plan view of the longitudinal shifting assembly.

The longitudinal shifting assembly 94 moves the floating bolster 38 and the die unit 40 along the X axis and includes a base plate 110 and a worm gear 112 that is supported on the base plate for rotation about the X axis, as shown in FIG. 6. A pair of upstanding end walls 114 are secured to the base plate and are journalled to support the worm gear 112. A pulley 116 is connected to one axial end of the worm gear so that a drive means can be connected to the pulley to rotate the worm gear in either direction on demand. The drive means preferably includes a bi-directional stepper or servo motor 118 that is fixed to the base plate, wherein the motor includes a drive shaft on which a pulley 120 is supported. A belt 122 connects the two pulleys 116, 120 so that drive from the motor 118 is transmitted to the worm gear 112.

An X-axis slide 124 is supported on the base plate between the end walls 114 and includes a coupling member that engages the worm gear 112 so that rotation of the worm gear causes the slide to move along the X axis relative to the base plate 110. A sensing mechanism 126 is provided for sensing the position of the X-axis slide relative to the base plate and for providing a signal to the controller indicative of the position so that the motor can be controlled to accurately position the slide. Preferably, the sensing mechanism is a linear encoder feedback device such as a glass slide or the like capable of providing a very accurate indication, e.g. within 1/10,000th of an inch, of the relative position of the X-axis slide relative to the base plate. The pin 104 includes a base that is secured to the X-axis slide 124 so that when the slide is translated along the X axis, the bolster 38 is moved longitudinally relative to the base platen 24.

Figure 5:
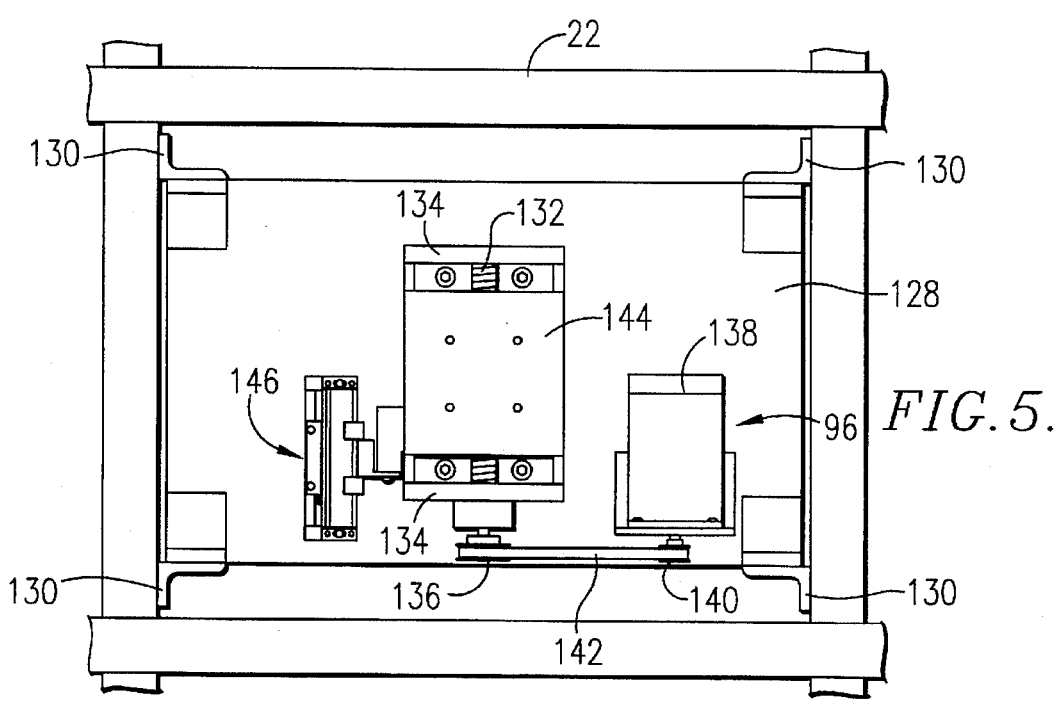
FIG. 5 is a top plan view of the lateral shifting assembly.

The lateral shifting assembly 96 is shown in FIG. 5, and moves the floating bolster 38 and the die unit 40 along the Y axis. A stationary tray 128 is suspended from the frame 22 beneath the base platen 24 by a plurality of suspension bars 130, and the lateral shifting assembly is supported on the tray. The lateral shifting assembly includes the stationary tray 128 and a worm gear 132 that is supported on the tray for rotation about the Y axis. A pair of upstanding end walls 134 are secured to the tray 128 and are journalled to support the worm gear 132. A pulley 136 is connected to one axial end of the worm gear so that a drive means can be connected to the pulley to rotate the worm gear in either direction on demand. The drive means preferably includes a bi-directional stepper or servo motor 138 that is fixed to the tray, wherein the motor includes a drive shaft on which a pulley 140 is supported. A belt 142 connects the two pulleys 136, 140 so that drive from the motor 138 is transmitted to the worm gear 132.

Figure 4:
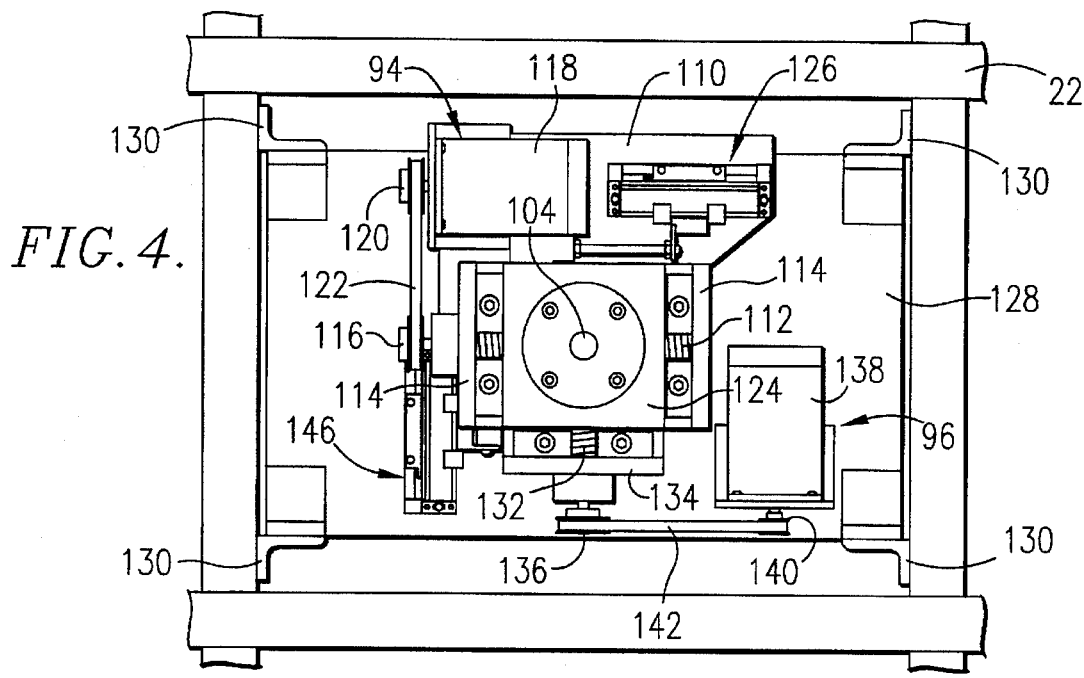
FIG. 4 is a top plan view of longitudinal and lateral shifting assemblies forming a part of the registration system.

A Y-axis slide 144 is supported on the tray between the end walls 134 and includes a coupling member that engages the worm gear 132 so that rotation of the worm gear causes the slide 144 to move along the Y axis relative to the tray 128. A sensing mechanism 146 is provided for sensing the position of the Y-axis slide relative to the tray and for providing a signal to the controller indicative of the position so that the motor 138 can be controlled to accurately position the slide. Preferably, the sensing mechanism is a linear encoder feedback device such as a glass slide or the like capable of providing a very accurate indication of the relative position of the Y-axis slide relative to the tray. The base plate 110 of the longitudinal shifting assembly 94 is secured to the Y-axis slide 144 as shown in FIG. 4, so that when the slide is translated along the Y axis, the longitudinal shifting assembly 94 is also moved laterally relative to the base platen so that the lateral position of the bolster 38 and die unit 40 is varied.

The angular shifting assembly 98 is shown in FIG. 2, and is connected between the base platen 24 and the floating bolster 38 for rotating the bolster and die unit relative to the base platen about the central axis defined by the pin 104. The angular shifting assembly 98 includes a bi-directional stepper or servo motor 148 that is secured to the base platen by a support plate 150, and a coupling member 152 secured to an end wall of the bolster. The motor 148 includes an output shaft extending in a direction parallel to the X axis, and an in-line worm gear 154 that engages the coupling member 152 to move the coupling member relative to the base platen upon energization of the motor. The motor and coupling member are offset laterally from the central axis defined by the pin 104 so that rotation of the worm gear 154 causes the bolster to rotate about the pin in the angular direction.

A sensing mechanism 156 is provided for sensing the position of the coupling member relative to the base platen and for providing a signal to the controller indicative of the angular position so that the motor 148 can be controlled to accurately position the bolster. Preferably, the sensing mechanism is a linear encoder feedback device such as a glass slide or the like capable of providing a very accurate indication of the relative position of the coupling member relative to the base platen.

Figure 8:
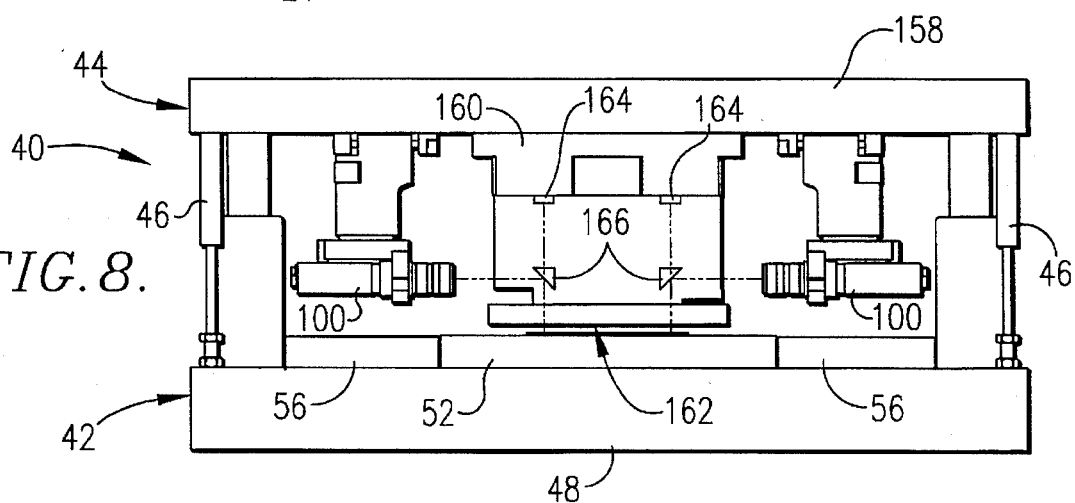
FIG. 8 is a rear elevational view of the die unit, illustrating the line of sight of a pair of cameras forming a part of the registration system.

As mentioned, the die unit 40 is carried on the floating bolster 38 and moves with the bolster in response to energization of the longitudinal, lateral and angular shifting assemblies in order to position the die unit relative to the material that is directed between the lower platen assembly 42 and the upper die assembly 44. As shown in FIG. 8, the upper die assembly includes an upper platen 158, and a frame 160 extending beneath the support plate. A die 162 is mounted adjacent the lower end of the frame 160 and is disposed for contact with the platen 52 of the lower assembly during each stroke of the ram platen 30. Reference indicia 164 are printed on the lower surface of the support plate immediately over each location on the die unit corresponding to the desired location to be occupied by one of the indicia 20 on the material when a corresponding defined area of the material is positioned in register with the die unit.

Preferably, each reference indicium 164 includes a closed line forming a square, wherein the open area of the square corresponds to the size of one of the indicia 20 on the material. For example, where solid, circular indicia 20 are printed on the web, the reference indicia 164 would include a square having an inner area equal in width and height to the diameter of the indicia on the material. A clear line of sight extends between each reference indicium 164 and the desired location of the corresponding indicium 20 and a split prism 166 is mounted on the die assembly along the line of sight so that images projected along the line of sight from immediately above and below the prism are both reflected laterally as a single compound image within which both the reference indicium and the actual indicia on the material are visible.

The cameras 100 of the registration system are suspended from the upper platen 158 of the die unit 40 with each camera aligned vertically with one of the prisms 166. The cameras are focused on the split prisms so that each camera receives the compound image reflected by the prism. Preferably, the cameras employ charge coupled devices (CCDs) for receiving the image from the prism. For example, each CCD camera may be provided with a two dimensional array made up of 512×489 pixels, and outputs analog signals representative of the image and these signals are converted to digital data by a conventional analog-to-digital conversion mechanism. Lenses are also provided for focusing the camera on the split prisms. Preferably, the lenses focus the array on an area of about ⅛th of an inch square to provide the desired resolution for registering the die unit and material to within about 3/10,000th of an inch.

Figure 9:
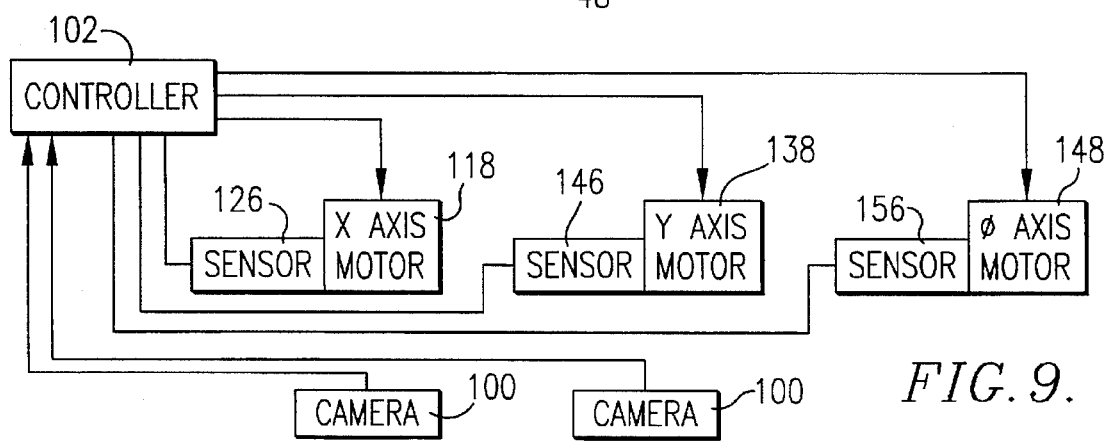
FIG. 9 is a schematic diagram of the registration system.

With reference to FIG. 9, the controller 102 is a computer control assembly including a processing unit, an input device, a display means, and memory for storing data. An analog-to-digital converter is provided for converting the analog output of the cameras to digital data, and suitable software is stored in the memory of the controller for receiving the image data from the cameras and comparing the relative positions of the reference indicia 164 and the indicia 20 within the images and for generating longitudinal, lateral and angular difference data representative of the difference between the actual position of the indicia and their desired positions as represented by the reference indicia. The difference data is then used by the controller to selectively energize each of the motors 118, 138, 148 to change the X, Y and Ø position of the die unit to register the die unit relative to the material so that one of the defined areas of the material is positioned in the desired predetermined relationship with the die unit. Preferably, the controller includes a 4-axis drive card so that the controller can control operation of the longitudinal, lateral and angular motors 118, 138, 148, as well as the motors 84 that drive the feed rollers 78.

Prior to operation, a reel of material to be processed is suspended on the supply assembly and trained through the vacuum tensioning assembly 70 and the guide rollers 72. The material is directed through the die unit 40 between the lower platen assembly 42 and the upper die assembly 44 and is wound around the drive rollers 78 and onto one of the take-up reels 80.

With reference to FIG. 7, when the press is operated, the material is first advanced by the feed rollers 78 along the X axis to feed one of the defined areas of the material a predetermined distance toward the die unit. This material feeding step is carried out at a very high, uniform speed, and is not used as a means for accurately positioning the material in the longitudinal direction. Rather, the feed rollers are relied upon to coarsely position the next succeeding defined area of the material in alignment with the die unit so that the indicia 20 associated with the defined area appear within the images received by the cameras 100. No further movement of the drive rollers 78 occurs subsequent to the initial feeding step until after stamping is complete.

Once the material has been advanced by the drive rollers, the material is gripped by the vacuum hold down bars 60 on the base platen 24 so that no further movement of the material relative to the base platen occurs during registration of the die unit 40. Once the material is secured in this way, images from the cameras are captured by the controller, and longitudinal, lateral and angular difference data is generated representative of the necessary adjustments to be made in the X, Y and Ø directions to register the die unit with the material. When the material is in proper registration relative to the die unit, the indicia 20 appear within the images in alignment with the reference indicia 164 printed on the upper platen 158.

Mathematical algorithms are employed to calculate the X, Y and Ø difference data, and although the X and Y adjustments of the die unit are independent of one another, the Ø-axis adjustment is dependent on the X and Y adjustments. In other words, any change of position of the die unit in the X or Y direction changes the position of the die unit in the Ø direction and vice versa. Thus, the algorithms employed for generating the difference data must accommodate this relationship in order to accurately adjust the longitudinal, lateral and angular position of the die unit.

In addition to calculating the difference data, the controller also calculates the difference between the actual longitudinal positions of the indicia 20 and the desired longitudinal positions so that when the drive rollers 78 are energized to feed a successive defined area of the material toward the die unit, the predetermined distance that the material is fed is varied to compensate for the noted difference. In this manner, feed of the material is controlled to prevent inaccuracies in the feeding step from accumulating to a point at which successive defined areas are no longer brought into coarse alignment with the die unit and the indicia 20 no longer appear within the images received by the cameras. The controller 102 operates the motors 84 of the drive rollers 78 in response to the calculated longitudinal difference data, and sets the predetermined distance that each subsequent defined area is to be advanced by the coarse feeding means in response to the longitudinal difference data generated by the comparison means.

Once the X, Y and Ø difference data has been generated, the controller 102 energizes the motors 118, 138, 148 to simultaneously carry out longitudinal, lateral and angular adjustment of the die unit so that, in a single step, the die unit is brought into registration with the material. Once registration is obtained, the material is secured in place on the die unit by drawing a vacuum through the vacuum bars 58 provided on the lower platen assembly 42, and the ram platen 30 is forced downward against the die unit to press the die against the platen and to carry out a stamping operation on the material. As the ram platen raises subsequent to stamping, the vacuum pressure of the bars 58, 60 is relieved, the motors 118, 138, 148 are again energized to return the die unit to a pre-established home position, and the drive motor 84 for the rollers 78 is energized to advance the material to bring a successive defined area of the material toward the die unit. If two webs are being processed, the carriages are shifted subsequent to each stamping operation to position the adjacent web in alignment with the die 162, and that web is advanced to position the next successive defined area in alignment with the die unit. In this manner, defined areas are stamped from one and then the other web repeatedly.

Because longitudinal, lateral and angular registration is achieved through movement of the die unit 40, it is not necessary to employ a feeding means which also serves as a longitudinal shifting assembly for obtaining precise X-axis registration. Thus, the feeding means is able to operate at a very high, uniform speed to position each successive defined area of the material in coarse registration with the die unit and the die unit is thereafter shifted to obtain the final, highly accurate registration, for example, plus or minus 3/10,000th of an inch. This increases the overall speed of the die press, permitting 40–45 strokes per minute instead of the 20–23 strokes possible with conventional die presses providing comparable accuracy of registration.

In addition, movement of the die unit rather than the material protects the material from being stretched or torn during registration. This feature of the invention provides a great advantage when working with relatively thin materials on the order of 1–2 mils.

Although the present invention has been described with reference to the preferred embodiment, it is noted that equivalents may be employed and substitutions made herein without departing from the scope of the invention as recited in the claims.

What is claimed is:

1. In a die cutting press for elongated material having defined, successive areas and indicia provided in predetermined positions relative to each of the defined areas, the press including a frame, a base platen fixed to the frame, a ram platen shiftable toward and away from the base platen, a die unit received in the space between the base platen and the ram platen, and a feeding means for advancing the material along a path of travel to successively feed the defined areas of the material a predetermined distance toward the die unit, a registration system for successively positioning the die unit in a desired predetermined relationship to the defined areas of the material as successive defined areas are brought into a position to be processed by the die unit, the registration system comprising:

a longitudinal shifting means for moving the die unit relative to the base platen along the path of travel of the material;

a lateral shifting means for moving the die unit relative to the base platen along a direction of travel transverse to the path of travel of the material;

an angular shifting means for rotating the die unit relative to the base platen about a reference axis perpendicular to a plane containing the material;

at least one camera for receiving images from the desired locations that are occupied by the indicia when the defined areas of the material are in the predetermined relationship relative to the die unit;

a reference means for providing reference image data representative of the desired locations of the indicia relative to the die unit;

a comparison means for comparing the reference image data with the actual positions of the indicia within the images received by the at least one camera after the material has been advanced by the feeding means, and for generating longitudinal, lateral and angular difference data representative of the difference in position between the indicia within the image and the desired locations of the indicia; and a control means for receiving the longitudinal, lateral and angular difference data and operating the longitudinal, lateral and angular shifting means to change the position of the die unit relative to the material to compensate for the difference in position between the indicia within the image and the desired locations of the indicia so that one of the defined areas of the material is positioned in the desired predetermined relationship with the die unit.

2. An apparatus as recited in claim 1, wherein the longitudinal shifting means includes an X-axis carriage supported on the apparatus for linear movement along the path of travel of the material, a drive motor, and a transmission means connected between the drive motor and the X-axis carriage for transmitting bi-directional driving force to the X-axis carriage.

3. An apparatus as recited in claim 2, wherein the X-axis carriage possesses a home position, the apparatus further comprising a sensing means for sensing the position of the X-axis carriage relative to the home position.

4. An apparatus as recited in claim 1, wherein the lateral shifting means includes a Y-axis carriage supported on the apparatus for linear movement in a direction transverse to the path of travel of the material, a drive motor, and a transmission means connected between the drive motor and the Y-axis carriage for transmitting bi-directional driving force to the Y-axis carriage.

5. An apparatus as recited in claim 4, wherein the Y-axis carriage possesses a home position, the apparatus further comprising a sensing means for sensing the position of the Y-axis carriage relative to the home position.

6. An apparatus as recited in claim 1, wherein the angular shifting means includes a drive motor supported in a fixed position relative to the base platen and a transmission means connected between the drive motor and the die unit for transmitting bi-directional angular driving force to the die unit.

7. An apparatus as recited in claim 1, further comprising a floating bolster supported on the base platen for movement along the path of travel of the material, along a direction of travel transverse to the path of travel of the material, and about a reference axis perpendicular to the plane containing the material, wherein the die unit is supported on and moves with the bolster, and the longitudinal, lateral and angular shifting means are connected between the bolster and the frame.

8. An apparatus as recited in claim 1, wherein two indicia are provided in predetermined positions relative to each of the defined areas of the material, and two cameras are supported on the apparatus for receiving images from the desired locations that are occupied by the two indicia when the corresponding defined area on the material is in the predetermined relationship relative to the die unit.

9. An apparatus as recited in claim 1, wherein the at least one camera includes a charge coupled device (CCD).

10. An apparatus as recited in claim 1, wherein the at least one camera is mounted on and moves with the die unit.

11. An apparatus as recited in claim 1, wherein the reference means includes indicia affixed to the die unit at positions which appear within the images received by the at least one camera.

12. An apparatus as recited in claim 1, wherein the longitudinal, lateral and angular shifting means each have a home position, and the control means returns all of the shifting means to the home positions after the material has been processed by the die unit.

13. An apparatus as recited in claim 1, wherein the control means operates the feeding means and sets the predetermined distance that each subsequent defined area is to be advanced by the feeding means in response to the longitudinal difference data generated by the comparison means.

14. A method for successively positioning a die unit in a desired predetermined relationship to defined areas of elongated material as successive defined areas are brought into a position to be processed by the die unit, the material including indicia provided in predetermined positions relative to each of the defined areas, the method comprising the steps of:

longitudinally advancing the material along a path of travel to successively feed the defined areas of the material a predetermined distance toward the die unit;

focusing at least one camera on the desired locations that are occupied by the indicia when the defined areas of the material are in the predetermined relationship relative to the die unit, and receiving images from the camera;

providing reference image data representative of the desired locations of the indicia relative to the die unit;

comparing the reference image data with the actual positions of the indicia within the images received by the at least one camera after the material has been advanced by the feeding means;

generating longitudinal, lateral and angular difference data representative of the difference in position between the indicia within the image and the desired locations of the indicia; and simultaneously moving the die along the path of travel of the material, along a direction of travel transverse to the path of travel, and relative to the base platen about a reference axis perpendicular to a plane containing the material to register the die unit with the material so that one of the defined areas of the material is positioned in the desired predetermined relationship with the die unit.

15. A method as recited in claim 14, wherein the die unit has a home position from which it is moved to compensate for the differences in position between the indicia within the image and the desired locations of the indicia, the method further comprising the step of returning the die unit to the home position before each successive registration operation.

16. A method as recited in claim 14, further comprising the step of setting the predetermined distance that each subsequent defined area is to be longitudinally advanced in response to the longitudinal difference data generated by the comparison means.

* * * * *